(12) United States Patent
Joo et al.

(10) Patent No.: US 9,066,425 B2
(45) Date of Patent: Jun. 23, 2015

(54) METHOD OF MANUFACTURING A PATTERNED TRANSPARENT CONDUCTOR

(71) Applicant: Rohm and Haas Electronic Materials LLC, Marlborough, MA (US)

(72) Inventors: Jake Joo, Cambridge, MA (US); Jerome Claracq, Oostakker (BE); Sylvie Vervoort, Ghent (BE); Mubasher Bashir, Terneuzen (NL); Peter Trefonas, Medway, MA (US); Garo Khanarian, Princeton, NJ (US); Kathleen O'Connell, Cumberland, RI (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 166 days.

(21) Appl. No.: 13/854,292

(22) Filed: Apr. 1, 2013

(65) Prior Publication Data
US 2014/0290979 A1    Oct. 2, 2014

(51) Int. Cl.
| | |
|---|---|
| C03C 25/68 | (2006.01) |
| H05K 1/02 | (2006.01) |
| H05K 3/06 | (2006.01) |
| H05K 9/00 | (2006.01) |
| H05K 3/00 | (2006.01) |

(52) U.S. Cl.
CPC ............ *H05K 1/0274* (2013.01); *H05K 3/0079* (2013.01); *H05K 3/061* (2013.01); *H05K 3/067* (2013.01); *G06F 2203/04103* (2013.01); *G06F 2203/04112* (2013.01);
(Continued)

(58) Field of Classification Search
CPC ... H05K 1/0274; H05K 3/067; H05K 3/0079; H05K 3/002

USPC .................. 216/42, 100, 101, 102
See application file for complete search history.

(56) References Cited

U.S. PATENT DOCUMENTS

| | | | |
|---|---|---|---|
| 8,284,332 B2 | 10/2012 | Geaghan et al. | |
| 2008/0053956 A1* | 3/2008 | Gomez et al. | 216/41 |

(Continued)

FOREIGN PATENT DOCUMENTS

KR    10-1172476    8/2012

OTHER PUBLICATIONS

Czaplewski, et al., Nonlithographic approach to nanostructure fabrication using a scanned electrospinning source, J. Vac. Sci. Technol. B 21(6), pp. 2994-2997, (Nov./Dec. 2003).

(Continued)

*Primary Examiner* — Binh X Tran
(74) *Attorney, Agent, or Firm* — Thomas S. Deibert

(57) ABSTRACT

Method of manufacturing patterned conductor is provided, comprising: providing a conductivized substrate, wherein the conductivized substrate comprises a substrate and an electrically conductive layer; providing an electrically conductive layer etchant; providing a spinning material; providing a masking fiber solvent; forming a plurality of masking fibers and depositing the plurality of masking fibers onto the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

17 Claims, 2 Drawing Sheets

(52) U.S. Cl.
 CPC ............... *H05K 2201/0108* (2013.01); *H05K 2201/0278* (2013.01); *H05K 9/0084* (2013.01)

(56) References Cited

U.S. PATENT DOCUMENTS

| | | | |
|---|---|---|---|
| 2011/0128137 A1* | 6/2011 | Varaprasad et al. | 340/435 |
| 2011/0300347 A1* | 12/2011 | Yoon et al. | 428/195.1 |
| 2012/0103669 A1 | 5/2012 | Pruneri et al. | |
| 2013/0017321 A1 | 1/2013 | Kim et al. | |

OTHER PUBLICATIONS

Huang, et al., A review on polymer nanofibers by electrospinning and their applications in nanocomposites, Composites Science and Technology, 63, pp. 2223 53 (2003).

* cited by examiner

METHOD OF MANUFACTURING A PATTERNED TRANSPARENT CONDUCTOR

The present invention relates generally to the field of manufacture of patterned transparent conductors.

Films that exhibit a high conductivity in combination with a high transparency are of great value for use as electrodes or coatings in a wide range of electronic applications, including, for example, touch screen displays and photovoltaic cells. Current technology for these applications involves the use of a tin doped indium oxide (ITO) containing films that are deposited through physical vapor deposition methods. The high capital cost of physical vapor deposition processes has led to the desire to find alternative transparent conductive materials and coating approaches. The use of silver nanowires dispersed as a percolating network has emerged as a promising alternative to ITO containing films. The use of silver nanowires potentially offer the advantage of being processable using roll to roll techniques. Hence, silver nanowires offer the advantage of low cost manufacturing with the potential of providing higher transparency and conductivity than conventional ITO containing films.

In capacitive touch screen applications, conductive patterns are required. One of the key challenges for such applications is that the patterns formed must be invisible (or nearly so) to the human eye.

One approach to providing nanowire based, patterned, transparent conductors has been disclosed by Allemand et al. in U.S. Pat. No. 8,018,568. Allemand et al. disclose an optically uniform transparent conductor comprising: a substrate; a conductive film on the substrate, the conductive film including a plurality of interconnecting nanostructures, wherein a pattern on the conductive film defines (1) an unetched region having a first resistivity, a first transmission and a first haze and (2) an etched region having a second resistivity, a second transmission and a second haze; and, wherein the etched region is less conductive than the unetched region, a ratio of the first resistivity over the second resistivity is at least 1000; the first transmission differs from the second transmission by less than 5%; and the first haze differs from the second haze by less than 0.5%.

Notwithstanding, there remains a need for an alternative method of manufacturing a patterned transparent conductor having an electrically conductive region and a non-electrically conductive region, wherein the electrically conductive region and the non-electrically conductive region are essentially indistinguishable to the human eye.

The present invention provides a method of manufacturing a patterned conductor, comprising: providing a conductivised substrate, wherein the conductivised substrate comprises a substrate and an electrically conductive layer; providing an electrically conductive layer etchant; providing a spinning material; providing a masking fiber solvent; forming a plurality of masking fibers and depositing the plurality of masking fibers onto the electrically conductive layer; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

The present invention provides a method of manufacturing a patterned transparent conductor, comprising: providing a conductivised transparent substrate, wherein the conductivised transparent substrate comprises a transparent substrate and an electrically conductive layer; providing an electrically conductive layer etchant; providing a spinning material; providing a masking fiber solvent; forming a plurality of masking fibers and depositing the plurality of masking fibers onto the electrically conductive layer; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

The present invention provides a method of manufacturing a patterned transparent conductor, comprising: providing a conductivised transparent substrate, wherein the conductivised transparent substrate comprises a transparent substrate and an electrically conductive layer, wherein the electrically conductive layer is an electrically conductive metal layer; providing an electrically conductive layer etchant; providing a spinning material; providing a masking fiber solvent; forming a plurality of masking fibers and depositing the plurality of masking fibers onto the electrically conductive layer; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

The present invention provides a method of manufacturing a patterned transparent conductor, comprising: providing a conductivised transparent substrate, wherein the conductivised transparent substrate comprises a transparent substrate and an electrically conductive layer; providing an electrically conductive layer etchant; providing a spinning material; providing a masking fiber solvent; forming a plurality of masking fibers and depositing the plurality of masking fibers onto the electrically conductive layer, wherein the plurality of masking fibers are formed and deposited onto the electrically conductive layer using a process selected from the group consisting of electrospinning, melt blowing, gas jet spinning, gas jet electrospinning, centrifuge spinning, needleless electrospinning, and melt electrospinning; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

The present invention provides a method of manufacturing a patterned transparent conductor, comprising: providing a conductivised transparent substrate, wherein the conductivised transparent substrate comprises a transparent substrate and an electrically conductive layer, wherein the electrically conductive layer is an electrically conductive metal layer; providing an electrically conductive layer etchant; providing a spinning material; providing a masking fiber solvent; forming a plurality of masking fibers and depositing the plurality of masking fibers onto the electrically conductive layer, wherein the plurality of masking fibers are formed and deposited onto the electrically conductive metal layer using a process selected from the group consisting of electrospinning, melt blowing, gas jet spinning, gas jet electrospinning, centrifuge spinning, needleless electrospinning, and melt electrospinning; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

The present invention provides a patterned transparent conductor made according to the method of the present invention.

DETAILED DESCRIPTION

Figure 1:
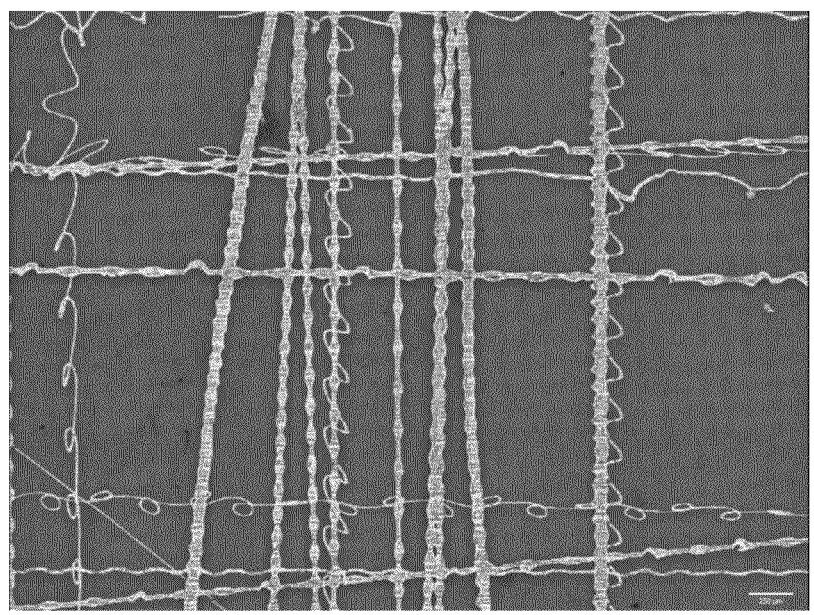
FIGS. 1-3 are top down optical microscopy images of the patterned transparent conductor of the present invention prepared according to the Example.

The term "Total transmittance" used herein and in the appended claims refers to the light transmission (in %) exhibited by the patterned transparent conductor of the present invention measured according to ASTM D1003-11e1.

The term "Haze" used herein and in the appended claims refers to the haze (in %) exhibited by the patterned transparent conductor of the present invention measured according to ASTM D1003-11e1.

The patterned conductor made using the method of the present invention is useful in a variety of applications such as in electromagnetic shielding applications. The preferred patterned transparent conductor made using the method of the present invention is particularly useful in capacitive touch screen applications. For use in such applications, it is desirable to provide a transparent conductor having a pattern of electrically conducting and non-electrically conducting regions. One significant challenge in providing such patterned transparent conductors is in maximizing the total transmittance and minimizing the haze.

The method of manufacturing a patterned conductor (preferably, a patterned transparent conductor) of the present invention preferably comprises: providing a conductivised substrate (preferably, a conductivised transparent substrate; more preferably, a metalized transparent substrate), wherein the conductivised substrate comprises a substrate (preferably, wherein the substrate is a transparent substrate) and an electrically conductive layer (preferably an electrically conductive metal layer); providing an electrically conductive layer etchant; providing a spinning material; providing a masking fiber solvent; forming a plurality of masking fibers and depositing the plurality of masking fibers onto the electrically conductive layer; optionally, compressing the plurality of masking fibers on the electrically conductive layer; exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and, exposing the plurality of masking fibers to the masking fiber solvent, wherein the plurality of masking fibers are removed to uncover the interconnected conductive network on the substrate.

Substrate used in the conductivised substrate in the method of the present invention can be selected from any know substrates. Preferably, the substrate used in the conductivised substrate is a transparent substrate selected from any known transparent substrates, including: both transparent conductive and transparent nonconductive substrates. Preferably, the transparent substrate is selected from the group consisting of polyethylene terephthalate (PET), polycarbonate (PC), polymethyl methacrylate (PMMA); polyethylene naphthalate (PEN), polyethersulfone (PES), cyclic olefin polymer (COP), triacetylcellulose (TAC), polyvinyl alcohol (PVA), polyimide (PI), polystyrene (PS) (e.g., biaxially stretched polystyrene) and glass (e.g., Gorilla® glass and Willow® glass both available from Dow Corning). More preferably, the transparent substrate is selected from the group consisting of glass, polyethylene, polyethylene terephthalate, polycarbonate and polymethyl methacrylate. Most preferably, the transparent substrate is polyethylene terephthalate.

The electrically conductive layer in the conductivised substrate (preferably, the conductivised transparent substrate) can comprise any known conductive material. Preferably, the electrically conductive layer comprises a conductive metal or metal oxide. Preferably, the electrically conductive layer is an electrically conductive metal layer selected from the group consisting of silver, copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt, titanium, alloys and oxides thereof. More preferably, the electrically conductive metal layer is selected from the group consisting of silver and silver alloyed with at least one element selected from the group consisting of copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt and titanium. Most preferably, the electrically conductive metal layer is silver.

The electrically conductive layer and the substrate (preferably, wherein the substrate is a transparent substrate) can preferably be coupled together using known techniques. Preferably, the electrically conductive layer can be applied to a surface of the substrate (preferably, wherein the substrate is a transparent substrate) by taking a conductive foil or sheet and laminating it onto the surface of the substrate using an adhesive. Preferably, the conductive layer can be deposited onto a surface of the substrate (preferably, wherein the substrate is a transparent substrate) using a method selected from the group consisting of sputtering, plasma spray coating, thermal spray coating, electrospray deposition, chemical vapor deposition (e.g., plasma enhanced chemical vapor deposition, metal organic chemical vapor deposition), atomic layer deposition, physical vapor deposition, pulsed laser deposition, cathodic arc deposition, plating, electroless plating and electrohydrodynamic deposition. Preferably, the conductive layer can be deposited onto a surface of the substrate (preferably, wherein the substrate is a transparent substrate) using a method selected from the group consisting of chemical solution deposition, spray painting, dip coating, spin coating, knife coating, kiss coating, gravure coating, screen printing, ink jet printing and pad printing. Most preferably, the conductive layer is sputter deposited onto a surface of the substrate (preferably, wherein the substrate is a transparent substrate).

The electrically conductive layer on the substrate (preferably, wherein the substrate is a transparent substrate) preferably has an average thickness of 10 to 200 nm (more preferably, 50 to 150 nm; most preferably, 90 to 110 nm).

The spinning material used in the method of the present invention preferably comprises a masking material. More preferably, the spinning material comprises a masking material and a carrier. One of ordinary skill in the art will know to select appropriate materials for use as the masking material and the carrier. Preferred masking materials are both suitable for deposition by a process selected from the group consisting of electrospinning, melt blowing, gas jet spinning, gas jet electrospinning, centrifuge spinning, needleless electrospinning, and melt electrospinning; and, suitable as an etch resist when exposing the electrically conductive layer (preferably an electrically conductive metal layer) to the electrically conductive layer etchant (preferably a metal etchant). Preferably, the masking material is selected from known electrospinnable film forming materials, such as, film forming polymers (e.g., polyacrylic acid, polyethylene oxide, polyvinyl alcohol, polyvinyl propylene); cellulose (e.g., hydroxy propyl cellulose, nitrocellulose); silk; and, blends thereof. More preferably, the masking material is polymethyl methacrylate. Most preferably, the masking material is polymethyl methacrylate having a weight average molecular weight, $M_W$, of 10,000 to 1,000,000 g/mol (preferably, 50,000 to 500,000 g/mol; more preferably, 100,000 to 500,000 g/mol; most preferably, 250,000 to 450,000 g/mol). Most preferably, the spinning material is a solution of polymethyl methacrylate in at least one of chloroform, methyl ethyl ketone, acetone, propanol, methanol, and isopropanol (preferably, a mixture of acetone and isopropanol).

Preferably, in the method of the present invention, the spinning material is formed into fibers and deposited onto the electrically conductive layer by a process selected from the group consisting of electrospinning, melt blowing, gas jet spinning, gas jet electrospinning, centrifuge spinning, needleless electrospinning, and melt electrospinning. More preferably, in the method of the present invention, the spinning material is formed into fibers and deposited onto the electrically conductive layer by electrospinning. Still more preferably, in the method of the present invention, the spinning material is formed into fibers and deposited onto the electrically conductive layer by electrospinning, wherein the spinning material is fed through a nozzle having a central opening, forming a plurality of masking fibers and depositing the plurality of masking fibers onto the electrically conductive layer on the transparent substrate. One of ordinary skill in the art will know to select appropriate electrospinning process conditions. Preferably, in the method of the present invention, the spinning material is fed through the nozzle at a flow rate of 0.1 to 100 μL/min (more preferably, 1 to 50 μL/min; still more preferably, 10 to 40 μL/min; most preferably 20 to 30 μL/min).

Preferably, in the method of the present invention, the nozzle is set at an applied positive difference of electric potential relative to the substrate. More preferably, the applied electric potential difference is 5 to 50 kV (preferably, 5 to 30 kV; more preferably, 5 to 25 kV; most preferably, 5 to 10 kV).

Optionally, the plurality of masking fibers deposited on the electrically conductive layer are compressed to ensure good contact between the plurality of masking fibers and the electrically conductive layer. Preferably, the plurality of masking fibers on the electrically conductive layer are compressed by placing the transparent substrate with the electrically conductive layer and the plurality of masking fibers thereon between two non-stick sheets (e.g., two teflon sheets) before compressing the plurality of masking fibers.

Preferably, in the method of the present invention, the electrically conductive layer, with the plurality of masking fibers deposited thereon, is exposed to an electrically conductive layer etchant, wherein the electrically conductive layer that is not covered by the plurality of masking fibers is etched away from the transparent substrate leaving an interconnected conductive network on the transparent substrate that is covered by the plurality of masking fibers. One of ordinary skill in the art will know to select an appropriate electrically conductive layer etchant for the electrically conductive layer used in the method of the present invention. Preferably, when the electrically conductive layer is silver, the electrically conductive layer etchant is selected from the group consisting of an ammonium hydroxide/hydrogen peroxide solution in methanol (preferably a 1:1:4 molar mixture of $NH_4OH$:$H_2O_2$:$CH_3OH$); an aqueous iron (III) nitrate nonahydrate solution (preferably 20 wt % solution of $Fe(NO_3)_3$ in deionized water); and, an aqueous phosphoric acid/nitric acid/acetic acid solution (preferably a 3:3:23:1 molar mixture of $H_3PO_4$:$HNO_3$:$CH_3COOH$:$H_2O$). When the electrically conductive layer is silver, the electrically conductive layer etchant is more preferably selected from the group consisting of an aqueous iron (III) nitrate nonahydrate solution (preferably 20 wt % solution of $Fe(NO_3)_3$ in deionized water); and, an aqueous phosphoric acid/nitric acid/acetic acid solution (preferably a 3:3:23:1 molar mixture of $H_3PO_4$:$HNO_3$:$CH_3COOH$:$H_2O$). When the electrically conductive layer is silver, the electrically conductive layer etchant is most preferably an aqueous iron (III) nitrate nonahydrate solution (preferably 20 wt % solution of $Fe(NO_3)_3$ in deionized water).

Preferably, in the method of the present invention, the plurality of masking fibers covering the interconnected conductive network on the substrate (preferably, wherein the substrate is a transparent substrate) are then removed. Preferably, the plurality of masking fibers are exposed to a masking fiber solvent, wherein the plurality of masking fibers are removed to uncover the interconnected conductive network on the substrate (preferably, wherein the substrate is a transparent substrate). One of ordinary skill in the art will know to select an appropriate masking fiber solvent for use in the method of the present invention. Preferably, the masking fiber solvent is selected from the group consisting of chloroform, methyl ethyl ketone, acetone, propanol, methanol, isopropanol and mixtures thereof (more preferably, a mixture of acetone and isopropanol; most preferably, acetone).

Preferably, in the method of the present invention, the interconnected conductive network is formed in a controlled pattern on the substrate. Preferably, the controlled pattern is selected from the group consisting of a regular pattern and an irregular pattern. More preferably, the interconnected conductive network is formed in an irregular pattern. Preferably, the controlled pattern is a grid pattern. Grid patterns include, for example, straight sided polygons (such as, diamonds, squares, rectangles, triangles, hexagons, etc.); circles; multi-curved shapes; combination curved and straight sided shapes (e.g., semi-circles); and, combinations thereof.

Preferably, in the method of the present invention, the plurality of masking fibers are formed having narrow diameters. The narrow fiber diameters are believed to facilitate the formation of an interconnected conductive network having narrow line widths such that the obstruction of light passing through the patterned transparent conductor is minimized in order to maximize transparency, to minimize haze and to minimize visibility of the interconnected conductive network to the human eye. Preferably, the masking fibers in the plurality of masking fibers are formed and deposited on the electrically conductive layer, wherein the deposited masking fibers have an average diameter of ≤200 µm. More preferably, the masking fibers in the plurality of masking fibers are formed and deposited on the electrically conductive layer, wherein the deposited masking fibers have an average diameter of ≤100 µm. Still more preferably, the masking fibers in the plurality of masking fibers are formed and deposited on the electrically conductive layer, wherein the deposited masking fibers have an average diameter of ≤20 µm. Most preferably, the masking fibers in the plurality of masking fibers are formed and deposited on the electrically conductive layer, wherein the deposited masking fibers have an average diameter of ≤2 µm.

The patterned transparent conductor made using the method of the present invention preferably exhibits a sheet resistance, $R_s$, (as measured using the method described herein in the Examples) of ≤100 Ω/sq (more preferably, ≤50 Ω/sq; still more preferably, ≤10 Ω/sq; most preferably ≤5 Ω/sq).

The patterned transparent conductor made using the method of the present invention preferably exhibits a total transmittance of ≥80% (more preferably ≥90%; most preferably ≥95%).

The patterned transparent conductor made using the method of the present invention preferably exhibits a haze of ≤5% (more preferably ≤4%; most preferably ≤3%).

Some embodiments of the present invention will now be described in detail in the following Example.

The total transmittance, $T_{Trans}$, data reported in the Example was measured according to ASTM D1003-11e1 using a BYK Instrument's Haze-gard plus transparency meter.

The haze, $H_{Haze}$, data reported in the Example was measured according to ASTM D1003-11e1 using a BYK Instrument's Haze-gard plus transparency meter.

The sheet resistance of the patterned transparent conductor was measured according to ASTM F1844 using a Delcom 717B non-contact conductance monitor and according to ASTM F390-11 using a Jandel HM-20 collinear 4 point probe test unit from Jandel Engineering Limited. The average sheet resistance measured using these techniques is reported in TABLE 1.

The metalized transparent substrate used in the Example was a 188 µm thick biaxially stretched polyethylene terephthalate film (available from Toray Industries, Inc. as Lumirror® U35) onto which a silver film having an average thickness of 100 nm was sputter deposited by Materion Large Area Coatings, LLC.

The polymethyl methacrylate in the spinning material used in the Example had a reported weight average molecular weight, $M_W$~360,000 (available from Scientific Polymer Products, Inc.).

The acetone/isopropanol solvent mixture in the spinning material used in the Example was a 90 wt % acetone/10 wt % isopropanol mixture.

The spinning material used in the Example was a 12 wt % solution of the polymethyl methacrylate in the acetone/isopropanol solvent mixture.

The aqueous iron (III) nitrate nonahydrate metal etchant solution used in the Example was prepared by weighing 20 g of iron (III) nitrate nonahydrate (available from Sigma-Aldrich as product number F3002) into a beaker and then adding 80 g of deionized water to the beaker with stirring.

EXAMPLE 1

Preparation Patterned Transparent Conductor

A plurality of masking fibers were electrospun onto the silver coated transparent substrate using a bench-top electrospinning cabin from IME Technologies equipped with a single nozzle spinning head and a rotating drum substrate carrier (module EM-RDC having a drum with a 100 mm diameter and 220 mm length). The nozzle used had an inner diameter of 0.5 mm. When electrospinning, the spinning material was fed to the nozzle using a ProSense Model No. NE1000 syringe pump set to deliver the spinning material at a flow rate of 25 µL/min. The electrospinning process was performed at ambient atmospheric conditions in a laboratory at 22° C. and relative humidity of 31%.

The metalized transparent substrate was wrapped around the rotary drum of a Module EM-RDC rotating drum collector from IME Technologies with the metalized surface facing out.

The remaining parameters for the spinning operation were as follows: the distance between the rotating substrate and the needle was set at 8 cm; the nozzle was set at 7.0 kV; the plate beneath the substrate was set at −0.1 kV; the drum rotation rate on the rotating drum collector (y axis) was set at 200 rpm; the needle scan speed (x axis) was set at 5 mm/sec; and, the needle scan distance was set at 120 mm. The spinning operation was allowed to proceed for 1 minute. The metalized transparent substrate was then rotated 90 degrees on the rotating drum (such that the orientation of the rotation of the metalized transparent substrate on the rotation drum is perpendicular to the first spinning pass), and the spinning operation was reinitiated and allowed to proceed for another 1 minute.

The metalized transparent substrate with a plurality of polymethyl methacrylate masking fibers deposited thereon was then removed from the rotating drum, placed between two sheets of Teflon, and placed in a Collin Laboratory Platen Press P300E preheated to a set point temperature of 170° C. The metalized transparent substrate was then subjected to a 10 bar compression force for 3 minutes at 170° C.; followed by a 150 bar compression force for 1 minute at 170° C. Quench cooling of the substrate was then performed by inserting two cooling cassettes at 16° C. (one above and one below the sample) and then closing the platen press. The sample was observed to reach room temperature within a few minutes.

The metalized transparent substrate with the compressed plurality of masking fibers thereon was then immersed in a bath of the aqueous iron (III) nitrate nonahydrate metal etchant solution for 1 minute with gentle stirring of the solution. The substrate was then given a 5 sec. dip in three successive deionized water baths at atmospheric temperature. The substrate was then allowed to air dry under ambient conditions leaving transparent substrate with an interconnected silver network covered by the plurality of compressed masking fibers.

The plurality of compressed masking fibers were then removed by immersing the substrate in an acetone bath for five minutes without agitation. The substrate was then removed from the acetone bath and allowed to dry under air at ambient conditions leaving a patterned transparent substrate with an uncovered interconnected silver network thereon.

The substrate was then cut into a 2.54 cm×2.54 cm sample for characterization. The total transmittance, $T_{Trans}$; the haze, $H_{Haze}$; and the sheet resistance of the sample were then measured at five different points on the sample. The average of those measurements is reported in TABLE 1. The reported $T_{Trans}$ and $H_{Haze}$ for the base polyethylene terephthalate substrate are reported to be 92.2% and 0.49%, respectively.

Figure 2:
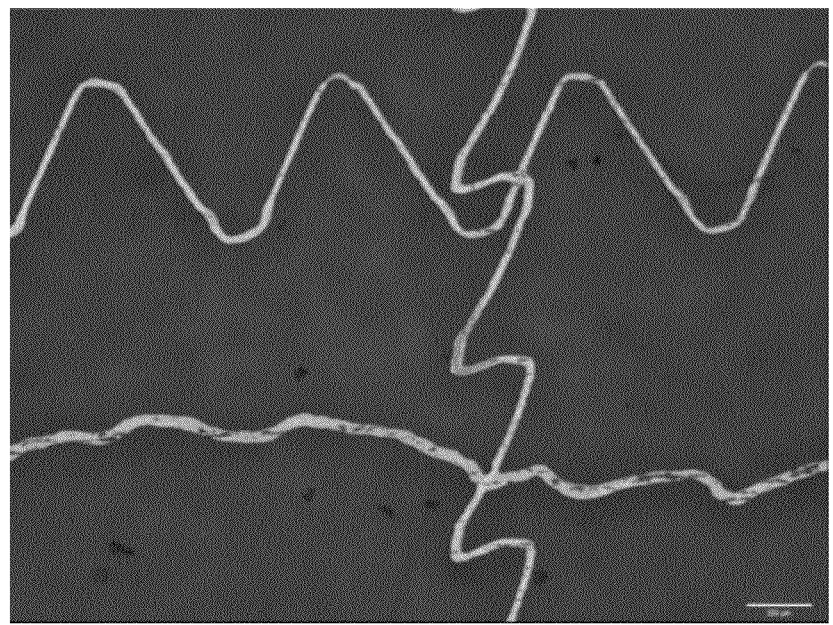
Figure 3:
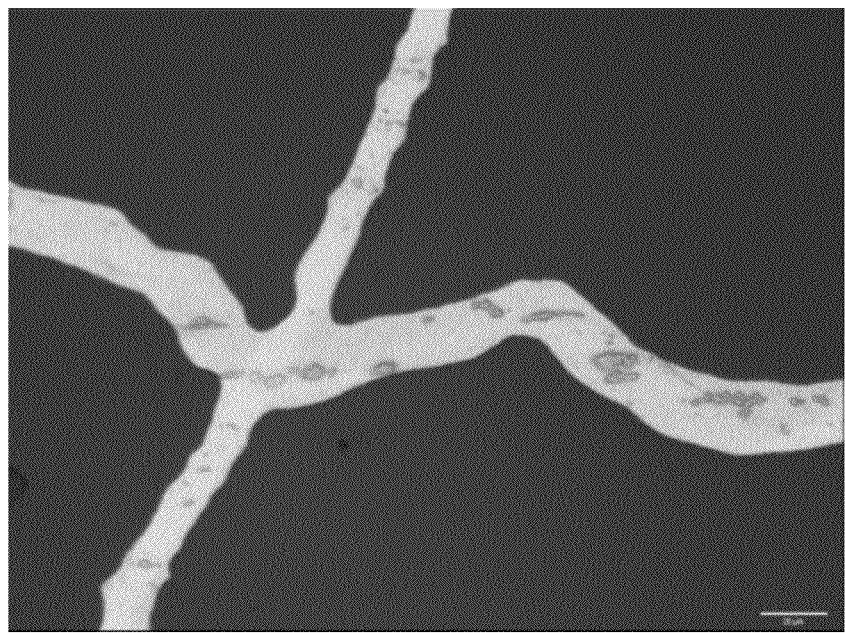

A plan view of the substrate was then taken at different magnifications (250 µm, 100 µm, and 20 µm) using an optical microscope. The images are provided as FIGS. 1-3, respectively.

TABLE 1

| Property | Measurement |
|---|---|
| silver wire width | 65.83 ± 28.78 µm |
| spacing between parallel silver wires | 543.32 ± 393.51 µm |
| thickness of silver wires (perpendicular to substrate surface) | 96.74 ± 12.12 µm |
| $T_{trans}$ | 82.8% |
| $H_{haze}$ | 2.88% |
| Sheet resistance | 4.16 Ω/sq |

We claim:

1. A method of manufacturing a patterned conductor, comprising:
    providing a conductivised substrate, wherein the conductivised substrate comprises a substrate and an electrically conductive layer;
    providing an electrically conductive layer etchant;
    providing a spinning material, wherein the spinning material comprises a masking material and a carrier;
    providing a masking fiber solvent;
    forming a plurality of masking fibers by processing the spinning material by a process selected from the group consisting of electrospinning, gas jet spinning, gas jet electrospinning, centrifuge spinning, needleless electrospinning, and melt electrospinning and depositing the plurality of masking fibers onto the electrically conductive layer;
    optionally, compressing the plurality of masking fibers on the electrically conductive layer;
    exposing the electrically conductive layer to the electrically conductive layer etchant, wherein the electrically conductive layer that is uncovered by the plurality of masking fibers is removed from the substrate, leaving an interconnected conductive network on the substrate covered by the plurality of masking fibers; and,
    exposing the plurality of masking fibers to the masking fiber solvent, wherein the plurality of masking fibers are removed to uncover the interconnected conductive network on the substrate.

2. The method of claim 1, wherein the patterned conductor is a patterned transparent conductor and wherein the conductivised substrate provided, comprises a transparent substrate and an electrically conductive layer.

3. The method of claim 2, wherein the electrically conductive layer is an electrically conductive metal layer selected from the group consisting of silver, copper, palladium, platinum, gold, zinc, silicon, cadmium, tin, lithium, nickel, indium, chromium, antimony, gallium, boron molybdenum, germanium, zirconium, beryllium, aluminum, magnesium, manganese, cobalt, titanium, alloys and oxides thereof.

4. The method of claim 3, wherein the electrically conductive layer is silver.

5. The method of claim 4, wherein the patterned transparent conductor exhibits a total transmittance of ≥80%; a haze of ≤5%; and, a sheet resistance of ≤5 Ω/sq.

6. The method of claim 3, wherein the plurality of masking fibers are formed and deposited onto the electrically conductive layer using electrospinning.

7. The method of claim 6, wherein the interconnected conductive network is a controlled pattern on the substrate.

8. The method of claim 6, wherein the masking material is selected from polyacrylic acid, polyethylene oxide, polyvinyl alcohol, polyvinyl propylene, cellulose, silk and blends thereof.

9. The method of claim 6, wherein the masking material is polymethyl methacrylate.

10. The method of claim 9, wherein the polymethyl methacrylate has a weight average molecular weight, $M_W$, of 10,000 to 1,000,000 g/mol.

11. The method of claim 9, wherein the polymethyl methacrylate has a weight average molecular weight, $M_W$, of 50,000 to 500,000 g/mol.

12. The method of claim 9, wherein the carrier is selected from the group consisting of at least one of chloroform, methyl ethyl ketone, acetone, propanol, methanol and isopropanol.

13. The method of claim 9, wherein the carrier is a mixture of acetone and isopropanol.

14. The method of claim 9, wherein the polymethyl methacrylate has a weight average molecular weight, $M_W$, of 100,000 to 500,000 g/mol.

15. The method of claim 14, wherein the carrier is a mixture of acetone and isopropanol.

16. The method of claim 12, wherein the polymethyl methacrylate has a weight average molecular weight, $M_W$, of 250,000 to 450,000 g/mol.

17. The method of claim 16, wherein the carrier is a mixture of acetone and isopropanol.

* * * * *